US006356153B1

(12) United States Patent
Ivanov et al.

(10) Patent No.: US 6,356,153 B1
(45) Date of Patent: Mar. 12, 2002

(54) RAIL-TO-RAIL INPUT/OUTPUT OPERATIONAL AMPLIFIER AND METHOD

(75) Inventors: Vadim V. Ivanov; Gregory H. Johnson, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/717,186

(22) Filed: Nov. 20, 2000

Related U.S. Application Data

(63) Continuation-in-part of application No. 09/359,482, filed on Jul. 22, 1999, now Pat. No. 6,150,883.

(51) Int. Cl.[7] .................................................. H03F 3/45

(52) U.S. Cl. ...................................... 330/253; 330/255

(58) Field of Search ................................ 330/253, 255, 330/260, 261

(56) References Cited

U.S. PATENT DOCUMENTS

| | | | | |
|---|---|---|---|---|
| 4,797,631 A | * | 1/1989 | Hsu et al. | 330/253 |
| 5,293,136 A | * | 3/1994 | Ryat | 330/258 |
| 5,311,145 A | | 5/1994 | Huijsing et al. | 330/255 |
| 5,933,055 A | * | 8/1999 | Dosho | 330/255 |

OTHER PUBLICATIONS

"Design Aspects of a Rail–to–Rail CMOS Op Amp", by Gierkink et al., MESA Research Institute, University of Twente, The Netherlands, pp. 23–28.

"Compact Low–Voltage Power–Efficient Operational Amplifier Cells for VLSI", by Klaas–Jan de Langen and Johann H. Huijsing, IEEE Journal of Solid–State Circuits, vol. 33, No. 10, Oct. 1998, pp. 1482–1496.

* cited by examiner

*Primary Examiner*—Robert Pascal
*Assistant Examiner*—Henry Choe
(74) *Attorney, Agent, or Firm*—W. Daniel Swayze, Jr.; W. James Brady; Frederick J. Telecky, Jr.

(57) ABSTRACT

A rail-to-rail differential amplifier includes first and second input terminals, and an output terminal and an input stage including differentially connected N-channel first and second input transistors, and differentially connected P-channel third and fourth input transistors. A P-channel first cascode transistor has a source coupled to a first supply voltage to the drain of the first input transistor. An N-channel cascode transistor has a source coupled by a second resistive element to a second supply voltage and to the drain of the third input transistor. A first gain boost amplifier has an output coupled to a gate of the first cascode transistor, a first input coupled to the source of the first cascode transistor and the drain of the first input transistor, and a second input coupled to a drain of the second input transistor and a bias control circuit. A second gain boost amplifier has an output coupled to a gate of the second cascode transistor, a first input coupled to the source of the second cascode transistor and to the drain of the third input transistor, and a second input coupled to a drain of the fourth input transistor and the bias control circuit. An output stage includes a pull-up transistor coupled between the first supply voltage and the output terminal, a pull-down transistor coupled between the second supply voltage and the output terminal, and a class AB bias circuit coupled between drain electrodes of the fist and second cascode transistors and between gate electrodes of the pull-up and pull-down transistors.

10 Claims, 6 Drawing Sheets

RAIL-TO-RAIL INPUT/OUTPUT OPERATIONAL AMPLIFIER AND METHOD

CROSS-REFERENCE TO RELATED PATENT APPLICATION

This application is a Continuation-in-part of application "RAIL-TO-RAIL INPUT/OUTPUT OPERATIONAL AMPLIFIER AND METHOD" filed Jul. 22, 1999 by Vadim V. Ivanov, Ser. No. 09/359,482, now U.S. Pat. No. 6,150,883.

BACKGROUND OF THE INVENTION

The invention relates generally to the field of differential amplifiers and operational amplifiers, and more particularly to an integrated circuit amplifier having a rail-to-rail common mode range both at the amplifier inputs and the amplifier output, and still more particularly to such an operational amplifier which is capable of linear, high speed operation with a rail-to-rail supply voltage of as little as approximately 1.2 volts.

The closest prior art includes U.S. Pat. No. 5,311,145 entitled "Combination Driver-Summing Circuit for Rail-to-Rail Differential Amplifier" issued May 10, 1994 to Huijsing et al. and incorporated herein by reference, the article "Compact Low-Voltage Power-Efficient Cells for VLSI", by K. Langen and J. Huijsing, IEEE Journal of Solid State Circuits, Volume 33, No. 10, pp. 1482–1496, and the article "Design Aspects of Rail-to-Rail CMOS OpAmp", by Gierkink, Holzmann, Wiegerink, and Wassenaar, proceedings of the 1st VLSI Workshop, May 6–8, 1997, Columbus, Ohio, pp. 23–28.

FIG. 1 of prior art patent 5,311,145 discloses an operational amplifier capable of "rail-to-rail operation". It includes a differential amplifier input stage that includes two pairs of differentially coupled input transistors, one with a tail current to the positive rail and the other with a tail current to the negative rail. A summing circuit is divided into first and second parts biased with a current from a single common floating current source to combine. The drain electrodes of the first pair of input transistors are coupled to the first part, and the drain electrodes of the second par of input transistors are coupled to the second part. A class A-B driver/output stage is coupled to the summing circuit to drive at least one output signal and which is operative over nearly the full rail-to-rail supply voltage range. The article by Langen and Huijsing mainly discloses the circuitry in Patent 5,311,145 in more detail. The paper by Gierkink, Holzmann, Wiegerink, and Wassenaar discloses use of a gain boost amplifier with a cascode connection and a differential amplifier. The circuitry disclosed in this reference is very complex, and needs a large compensation capacitor. There is a need to provide a simpler circuit.

The circuit described in patent 5,311,145 is a two-stage circuit that does not have the capability of operating at a rail-to-rail supply voltage of less than approximately 2.2 volts. Regardless of the power supply voltage, the gain of this circuit is too low for many applications. The speed-power figure of merit for the circuits described in patent 5,311,145 is much lower than desirable at the lower rail-to-rail supply voltage.

All of the known prior art rail-to-rail input/output CMOS operational amplifiers have lower speed than desirable due to parasitic elements in their folded cascode circuits.

Furthermore, noise in the prior art rail-to-rail to input/output CMOS operational amplifiers is higher than desirable because of the presence of the folded cascode transistors in the signal path.

Accordingly, there is an unmet need for a much faster rail-to-rail input/output operational amplifier operable at lower rail-to-rail supply voltages, and with lower noise, than the closest prior art and also operable at a much higher gain-speed-power figure of merit even at the lowest end of the rail-to-rail supply voltage range.

SUMMARY OF THE INVENTION

Accordingly, it is an object of the invention to provide an operational amplifier or differential amplifier which is linearly operable at a lower range of rail-to-rail supply voltages than the closest prior art.

It is another object of the invention to provide an operational amplifier or differential and amplifier which is linearly operable lower noise at a lower range of rail-to-rail supply voltage than the closest prior art.

It is another object of the invention to provide a differential amplifier or operational amplifier operable from lower supply voltages and having a substantially higher gain-speed-power figure of merit than the closest prior art, even at lower rail-to-rail supply voltage levels wherein those at which the closest prior art differential or operational amplifiers are operable.

Briefly described, and in accordance with one embodiment thereof, the invention provides a differential amplifier with a rail-to-rail common mode input voltage range, including a first supply voltage rail (V+) and a second supply voltage rail (V−), first (11) and second (12) input terminals for receiving a differential input signal, and a rail-to-rail input stage, wherein an input signal is applied between gates of differentially connected first (13) and second (14) input transistors of a first channel type, and also is applied between gates of differentially connected third (17) and fourth (18) input transistors of the second channel type. A signal produced by the first input transistor (13) is applied to a junction between a source of a first cascode transistor (26) of the second channel type and a first resistive element (89) also coupled to the first supply voltage rail (V+). A signal produced by the third input transistor (17) is applied to a junction between a source of a second cascode transistor (37) of the first channel type and a second resistive element (88) also coupled to the second supply voltage rail (V−). A signal produced between a drain of the first input transistor (13) and a drain of the second input transistor (14) is applied between first (−) and second (+) inputs of a first gain boost amplifier (58A) having an output (64) coupled to the gate of the first cascode transistor (26). A signal produced between the drain of the third input transistor (17) and the drain of the fourth input transistor (18) is applied between first (−) and second (+) inputs of a second gain boost amplifier (57A) having an output (56) coupled to the gate of the second cascode transistor (37). An output stage includes a pull-up transistor (30) of the second channel type coupled between the first supply voltage rail and the output terminal, a pull-down transistor (45) of the first channel type coupled between the second supply voltage rail (V−) and the output terminal, and a class AB bias circuit (29) coupled between drain electrodes of the first (26) and second (37) cascode transistors, which are coupled to gate electrodes of the pull-up and pull-down transistors, respectively.

A first amplification path through the source of the first cascode transistor (26) constitutes a high frequency signal amplification path, and a second amplification path through the gate of the first cascode MOSFET (26) constitutes a lower frequency amplification path in parallel with the first amplification path. A third amplification path through the source of the second cascode transistor (37) constitutes a high frequency signal amplification path, and a fourth amplification path through the gate of the second cascode MOSFET (37) constitutes a lower frequency amplification path in parallel with the third amplification path. In the described embodiments, a bias transistor (85) is coupled between the second input (+) of the first gain boost amplifier (58A) and the second input (+) of the second gain boost amplifier (57A). The gate of the bias transistor (85) is connected to a gate of a feedback reference transistor (83) and to an output (84) of a control amplifier (80). A first input (+) of the control amplifier (80) is coupled to a junction (82) between a source of the feedback reference transistor (83) and a constant current source (81), and a second input (−) of the control amplifier (80) is coupled to the source of the bias transistor (85).

DETAILED DESCRIPTION OF THE PREFERRED EMBODIMENTS

Figure 1:
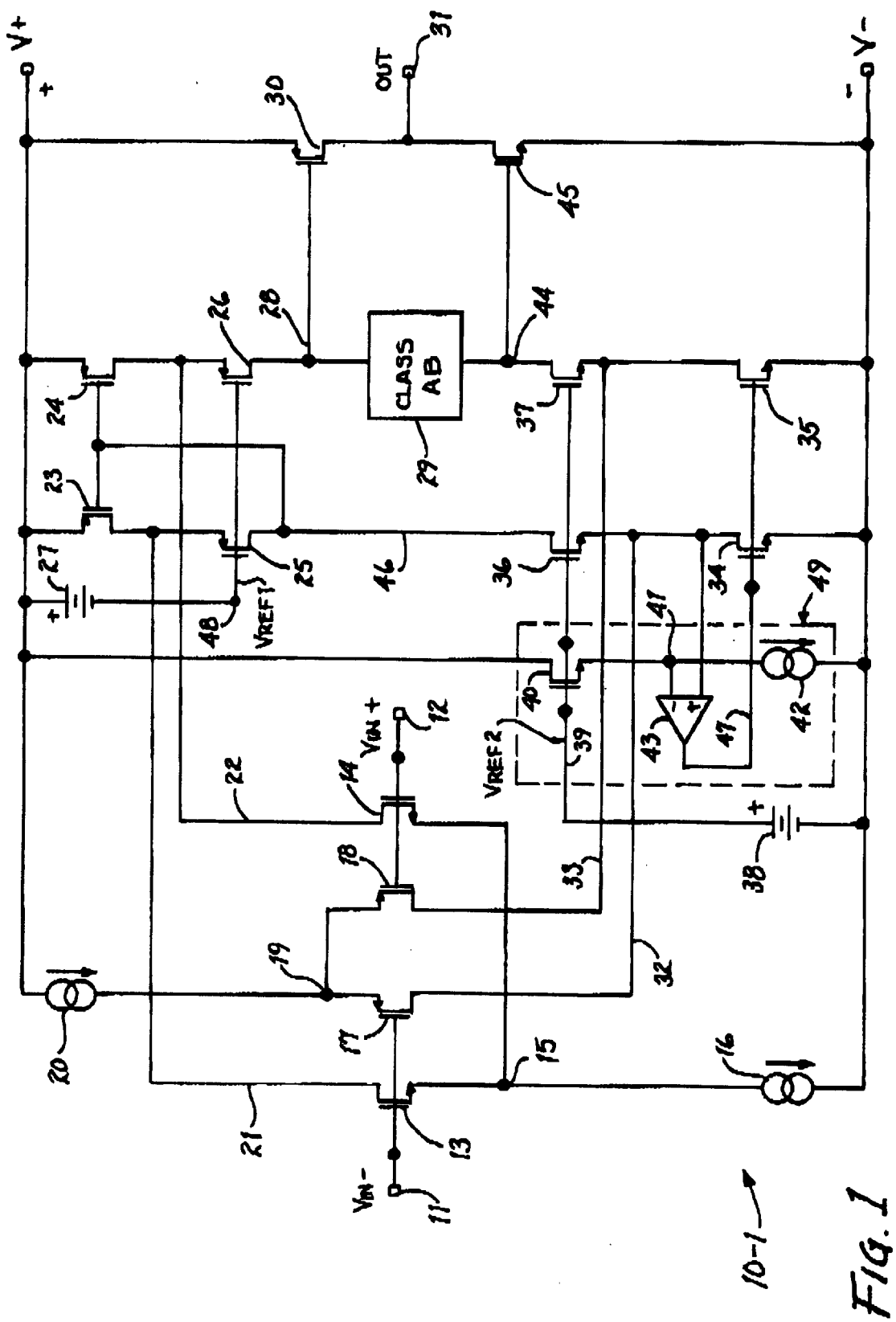
FIG. 1 is a schematic diagram of a first embodiment of an operational amplifier of the present invention.

Referring to FIG. 1, a first operational amplifier 10-1 includes a differential input stage including N-channel MOSFETs 13 and 14, P-channel MOSFETs 17 and 18, and constant current sources 16 and 20. The gate electrodes of MOSFETs 13 and 17 are connected to input conductor 11 which receives an input voltage $V_{IN-}$. The gate electrodes of MOSFETs 14 and 18 are connected to input conductor 12, which receives an input voltage $VIN_{IN+}$. The sources of N-channel input MOSFETs 13 and 14 are connected by conductor 15 to one terminal of constant current source 16, the other terminal of which is connected to a lower supply rail voltage V−. The sources of P-channel input MOSFETs 17 and 18 are connected by conductor 19 to one terminal of constant current source 20, the other terminal of which is connected to a higher supply rail voltage V+. This input stage is the same as in FIG. 1 of above mentioned Patent 5,311,145 and its operation is fully described therein.

The collectors of N-channel input MOSFETs 13 and 14 are connected by conductors 21 and 22 to the drains of P-channel current mirror MOSFETs 23 and 24, the sources of which are connected to V+. The gate electrodes of current mirror MOSFETs 23 and 24 are connected by conductor 46 to the drain of a P-channel cascode MOSFET 25 having its source connected by conductor 21 to the drains of N-channel input MOSFET 13 and P-channel current mirror MOSFET 23. The drain of P-channel current mirror MOSFET 24 is connected by conductor 22 to the source of a P-channel cascode MOSFET 26, the drain of which is connected by conductor 28 to one terminal of a class AB bias circuit 29 and to the gate of a P-channel output MOSFET 30 having its source connected to V+ and its drain connected to output conductor 31.

Class AB bias circuit 29 of FIG. 1 herein can be the same as the class AB bias circuit designated by reference numeral 20 in FIG. 1 of above mentioned Patent 5,311,145, and its structure and operation are fully described therein. The gate electrodes of cascode MOSFETs 25 and 26 are connected to a reference voltage $V_{REF1}$ produced on terminal 48 of the lower voltage of a constant voltage circuit 27 having its other terminal connected to V+.

The drain electrodes of P-channel input MOSFETs 17 and 18 are connected by conductors 32 and 33 to drain electrodes of N-channel current source MOSFETs 34 and 35. The sources of N-channel current mirror MOSFETs 34 and 35 are connected to V−. The drain of current mirror MOSFET 34 is connected by conductor 32 to the (+) input of an amplifier 43. The (−) input of amplifier 43 is connected by conductor 41 to the source of an N-channel cascode transistor 40 having its drain connected to V+ and its gate connected to the (+) terminal of a constant reference voltage circuit 38 having its (−) terminal connected to V−. The output of amplifier 43 is connected to the gates of N-channel current source MOSFETs 34 and 35. The drains of N-channel current source MOSFETS 34 and 35 are connected to the sources of N-channel cascode MOSFETs 36 and 37, which have their gate electrodes connected by conductor 39 to reference voltage source circuit 38. The drain of N-channel cascode MOSFET 36 is connected to conductor 46. The drain of cascode MOSFET 37 is connected by conductor 44 to another terminal of class AB bias circuit 29 into the gate electrode of N-channel output MOSFET 45, which has its drain connected to output conductor 31 and its source connected to V−.

Figure 4:
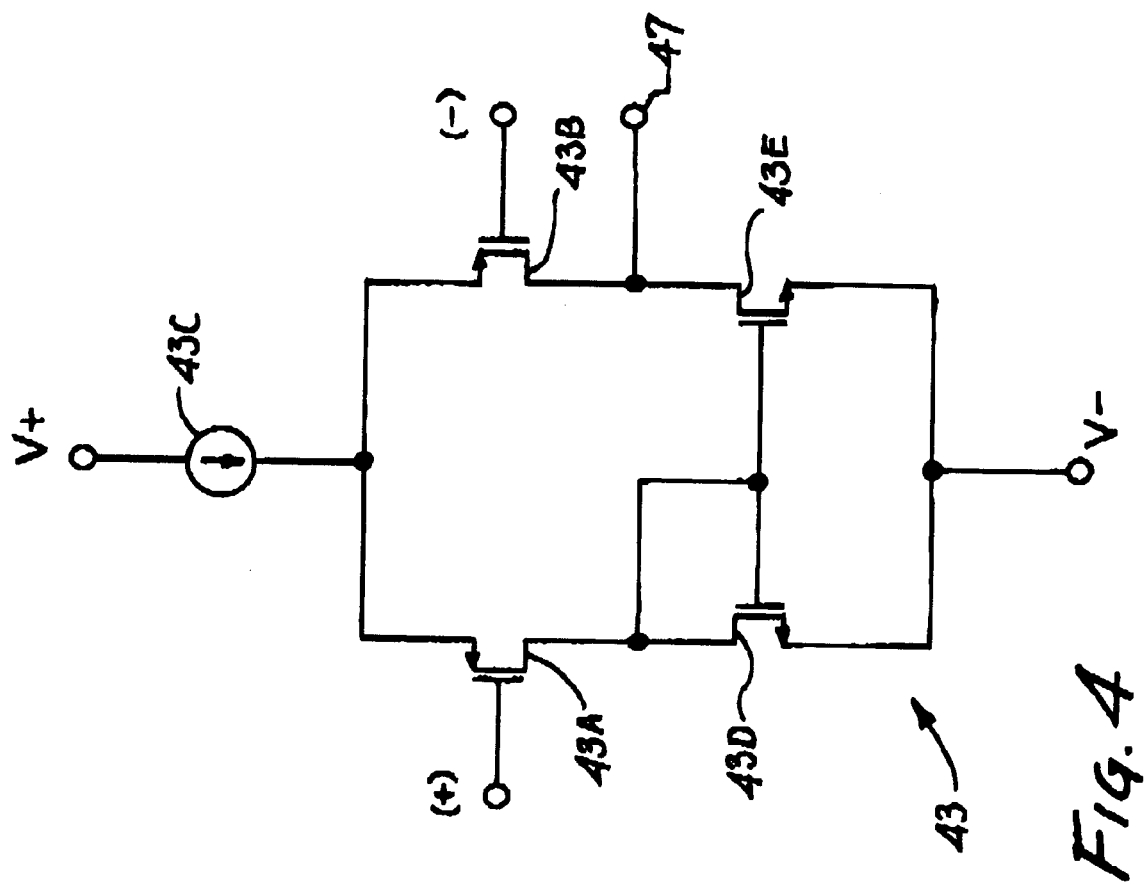
FIG. 4 is a schematic design of amplifier 43 in FIGS. 1–3.

Referring to FIG. 4, amplifier 43 is a simple differential amplifier having its (+) and (−) inputs connected to the gates of P-channel input MOSFETs 43A and 43B, respectively. The sources of MOSFETs 43A and 43B are connected to one terminal of a constant source 43C, which can be a P-channel current mirror output MOSFET. The other terminal of the constant current source 43C is connected to the positive supply rail voltage V+. The drain of MOSFET 43A is connected to the drain and gate of an N-channel MOSFET 43D, the source of which is connected to the negative supply rail V−. MOSFET 43D functions as a load device for input MOSFET 43A and as a current mirror control transistor for N-channel MOSFET 43E, the gate, drain, and source of which are connected to the gate of MOSFET 43A, the drain of input MOSFET 43B, and V−, respectively. MOSFET 43E functions as a current mirror output transistor and as a load for input MOSFET 43D. The output 47 of amplifier 43 is connected to the drains of MOSFETs 43B and 43E in FIG. 1. Amplifier 43 can operate on a very low rail-to-rail supply voltage, and allows amplifier 10-1 to also operate at a very low supply rail-to-rail supply voltage.

Referring again to FIG. 1, it should be noted that the floating circuit source of prior art patent 5,311,145 is not used to bias the summing circuitry including MOSFETs 23 and 24 and MOSFETs 34 and 35. Instead, above described source follower MOSFET 40, bias amplifier 43, and current source 42 are provided as a current bias circuit 49 in FIG. 1 by dotted lines.

The circuit of FIG. 1 provides linear operation if the difference between V+ and V− is greater than the sum of the threshold voltage of MOSFET 23, the drain-source voltage of cascode MOSFET 36 or 37, and the drain-source voltage of current source MOSFET 34 or 35. Since the threshold voltage of MOSFET 23 is typically about 900 millivolts and the drain-source voltages of current source MOSFET 34 or 35 and cascode MOSFET 36 or 37 are approximately 200 millivolts each. Therefore, the minimum supply voltage is the sum of 900 millivolts plus 200 millivolts plus 200 millivolts, or 1.3 volts. The minimum operating voltage of the operational amplifier 10-1 of FIG. 1 is approximately 1.3 volts.

Figure 2:
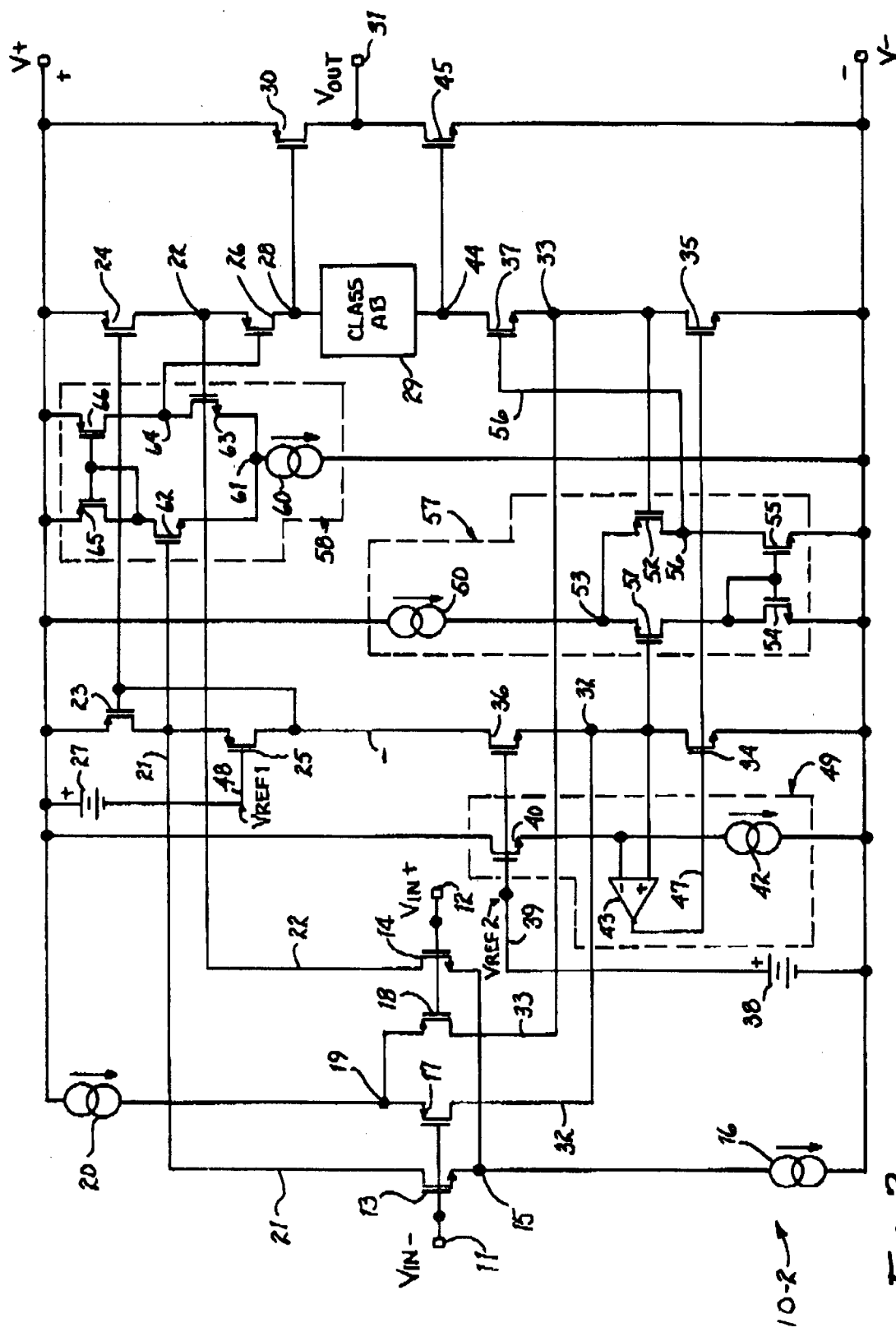
FIG. 2 is a schematic diagram of another embodiment of the invention in which higher gain is achieved than for the circuit of FIG. 1.

Referring to FIG. 2, a second operational amplifier 10-2 of the present invention includes an input stage which can be identical to that of the operational amplifier 10-1 of FIG. 1, wherein the same reference numerals are used to identify corresponding circuit elements. The circuit including amplifier 43, current source 42, and the circuitry including reference voltage circuit 27, current mirror transistors 23 and 24, P-channel cascode transistors 25 and 26, output MOSFETs 30 and 45, class AB bias circuit 29, P-channel cascode transistors 25 and 26, and N-channel cascode transistors 40, 36, and 37 are the same as in FIG. 1.

However, in FIG. 2 the gates of cascode MOSFETs 26 and 37 are not connected to $V_{REF1}$ and $V_{REF2}$, respectively. Instead, the gate of cascode MOSFET 26 is connected by conductor 64 to the output of a gain boost amplifier 58 that includes differentially connected N-channel input MOSFETs 62 and 64 and P-channel current mirror load MOSFETs 65 and 66. The drains of N-channel input MOSFETs 13 and 14 are connected to the gate electrodes of N-channel input MOSFETs 62 and 63, the sources of which are coupled by conductor 61 to a constant current source 60 that is connected to V−. P-channel MOSFETs 65 and 66 form a current mirror circuit which functions as the load devices for input MOSFETs 62 and 63. MOSFETs 62, 63, 65, and 66 in current source 60 thus form the simple differential gain boost amplifier 58, the inverting output 64 of which is connected to the gate of P-channel cascode MOSFET 26.

The body electrodes of N-channel input MOSFETs 62 and 63 are connected to V−. This results in a source-to-body reverse bias voltage that increases their threshold voltages to a value 200 to 400 millivolts greater than the threshold of P-channel cascode MOSFET 26. This allows linear operation of MOSFET 52.

Similarly, the gate of cascode MOSFET 37 is connected by conductor 56 to the output of another gain boost amplifier 57 which includes differentially connected P-channel input MOSFETs 51 and 52 and N-channel current mirror load MOSFETs 54 and 55. Constant current source 50 can be an ordinary P-channel current mirror output transistors connected between V+ and conductor 53, and constant current mirror 60 can be an N-channel current mirror output transistor connected between V− and conductor 61. Gain boost amplifiers 57 and 58 therefore operate with a very low rail-to-rail supply voltage, and allow amplifier 10-2 of FIG. 2 to operate with a very low rail-to-rail supply voltage, and provide greatly increased gain over the amplifier 10-1 in FIG. 1 and any of the amplifiers of the closest prior art.

The drains of P-channel input MOSFETs 17 and 18 are connected by conductors 32 and 33 to the gates of P-channel input MOSFETs 51 and 52 of another simple differential amplifier including N-channel current mirror transistors 54 and 55 as load devices and current source 50 providing a tail current from V+. The body electrodes of P-channel input MOSFETs 51 and 52 are connected to V+. This results in a source-to-body reverse bias voltage that increases their threshold voltages to a value 200 to 400 millivolts greater than the threshold of cascode MOSFET 37, the gate of which is connected to the inverting output 56 of the intermediate differential stage. This allows linear operation of MOSFET 63.

The provision of the gain boost amplifier 58 provides amplification of the input signal through two paths, one through the source of cascode MOSFET 26 and the other through the gate of cascode MOSFET 26. The first amplification path through the source of cascode transistor 26 is a high frequency signal amplification path, and the second amplification path through the gate of cascode MOSFET 26 is a lower frequency amplification path in parallel with the first. This results in an increase of approximately 50 dB of gain at low frequencies.

My simulations and measurements indicate that the gain multiplied by the speed divided by the power for the circuit of FIG. 2 is approximately 5 to 10 times better than the speed-power ratio of the circuits shown in patent 5,311,145.

Figure 3:
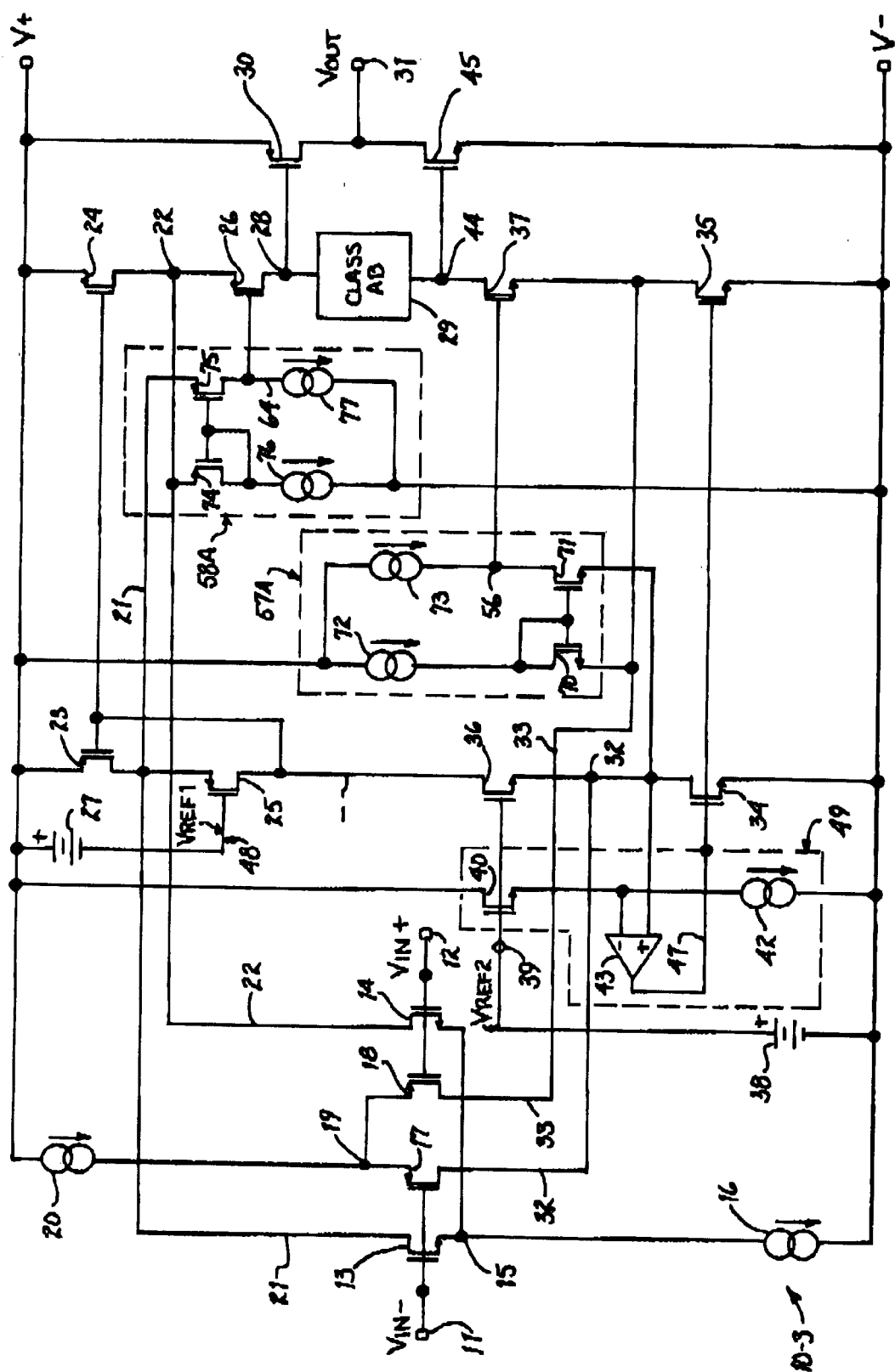
FIG. 3 is a schematic diagram of a third embodiment of the invention in which higher gain is achieved than for the circuit of FIG. 1.

Referring to FIG. 3, a third operational amplifier 10-3 of the present invention includes an input stage identical to that of FIG. 2. The gain boost circuitry including differential amplifier 43, current source 42, and N-channel cascode MOSFET 40 are the same as in FIG. 2. The N-channel current MOSFETs 34 and 35 are connected the same as in FIG. 2. P-channel MOSFETs 23 and 24 and P-channel MOSFETs 25 and 26 and reference voltage source circuit 27 also are connected the same as in FIG. 2. Class AB bias circuit 29 and output MOSFETs 30 and 45 also are connected the same as in FIG. 2. However, the gain boost amplifiers 57 and 58 in FIG. 3 are different than in FIG. 2, and may be advantageous for high voltage rail-to-rail supply voltages.

In FIG. 3, gain boost amplifier 58A includes P-channel input MOSFETs 74 and 75 with their sources connected as the differential inputs and constant circuit sources 76 and 77 as load devices. Gain boost amplifier 57B includes N-channel input MOSFETs 70 and 71 with their sources connected as the different inputs and constant current sources 72 and 73 as load devices. Conductor 33 is connected to the sources of N-channel MOSFETs 70 and 71. The gates of MOSFETs 70 and 71 are connected to the drain of MOSFET 70 and to one terminal of a constant current source 72, the other terminal of which is connected to V+. The drain of MOSFET 71 is connected by conductor 56 to the gate of cascode MOSFET 37 and to one terminal of constant current source 73, the other terminal of which is connected to V+.

MOSFETs 70 and 71 function as inputs of a common gate differential amplifier stage which includes current sources 72 and 73 as load devices. The source of N-channel MOSFET 70 receives the signal on conductor 33 as an input, and the source of N-channel MOSFET 71 receives the signal on conductor 32 as an input. An inverted output signal is produced on conductor 56 and applied to the gate electrode of cascode MOSFET 37. Similarly, P-channel MOSFETs 74 and 75 receive the signals on conductors 22 and 21, respectively, as input signals. Current sources 76 and 77 function as load devices, and an inverted output signal is produced on conductor 64 and applied to the gate of cascode MOSFET 26.

Figure 5:
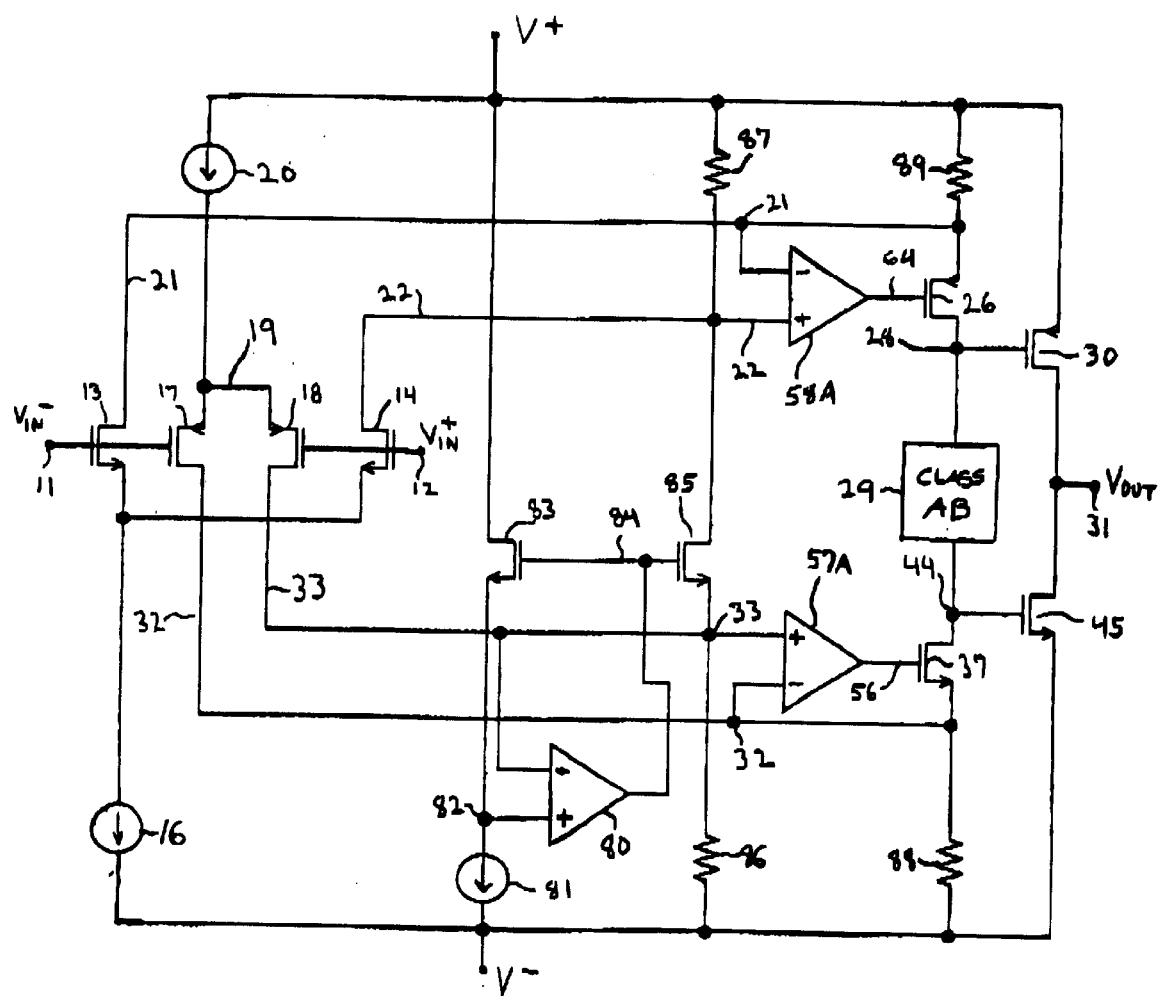
FIG. 5 is a schematic diagram of a fourth embodiment of the invention in which higher gain is achieved than for the circuit of FIG. 1.

Referring to FIG. 5, a fourth operational amplifier 10-4 of the present invention includes an input stage, including input transistors 13, 14, 17, 18 and current sources 16 and 20; this input stage is identical to that of FIGS. 2 and 3. P-channel output transistor 30, N-channel output transistor 45, class AB circuit 29, P-channel cascode transistor 26, and N-channel cascode transistor 37 are connected in FIG. 5 essentially similarly to their connections in FIG. 3.

However, in FIG. 5 the source of P-channel cascode transistor 26 is connected by conductor 21 to one terminal of a resister 89, the other terminal of which is connected to V+. Conductor 21 also is connected to the (−) input of a gain boost amplifier 58A, which can be similar to gain boost amplifier 58 of FIG. 3. The gate of cascode transistor 26 is connected to the output of gain boost amplifier 58A. The (+) input of gain boost amplifier 58A is connected to conductor 22, and the output 64 of gain boost amplifier 58A is connected to the gate of cascode transistor 26. Cascode transistor 26 actually can be considered to be an output transistor of gain boost amplifier 58A.

Similarly, the source of N-channel cascode transistor 37 is connected by conductor 32 to one terminal of a resister 88 and to the (−) input of a gain boost amplifier 57A, which can be similar to gain boost amplifier 57 of FIG. 3. The other terminal of resister 88 is connected to V−. The (+) of gain boost amplifier 57A is connected to conductor 33, and the output 56 of gain boost amplifier 57A is connected to the gate of cascode transistor 37. Cascode transistor 37 can be considered to be an output transistor of gain boost amplifier 57A.

Conductor 33 also is connected to the junction between the source of an N-channel cascode transistor 85 and one terminal of a resister 86. The other terminal of resister 86 is connected to V−. Conductor 33 also is connected to the (−) input of a differential bias control amplifier 80, the output of which is connected by conductor 84 to the gate of cascode transistor 85. The drain of cascode transistor 85 is connected by conductor 22 to one terminal of a resister 87, the other terminal of which is connected to V+. Conductor 84 also is connected to the gate of an N-channel feedback reference transistor 83, the source of which is connected by conductor 82 to the (+) input of amplifier 80 and to one terminal of a constant current source 81, the other terminal of which is connected to V−. The drain of feedback reference transistor 83 is connected to V+.

In operation, cascode transistor 85 simulates a "floating" constant current source connected between conductors 22 and 33. Note that use of an actual floating current source between conductors 22 and 33 would be impractical for low rail-to-rail supply voltages, because more supply voltage would be required for operation of the floating current source than would be available between conductors 22 and 33. Bias control amplifier 80 operates to maintain the source voltage of cascode transistor 85 on conductor 33 at the same voltage as the source of feedback reference transistor 83 on conductor 82. If the sizes of transistors 83 and 85 are equal, then the current through both transistors 83 and 85 is equal to the constant current through constant current source 81, even as the voltage on conductor 33 vary substantially. (The bias control circuit including transistors 83 and 85, amplifier 80, and constant current source 81 has the advantage that it can operate at a very low rail-to-rail voltage equal to the sum of a $V_{GS}$ voltage and two $V_{DS}$ saturation voltages.)

Operational amplifier 80 operates to keep the voltages of conductors 82 and 33 equal, so if transistors 83 and 85 are of the same size, then the same constant current flowing through constant current source 81 also flows through both transistors 83 and 85 even though the voltage on conductor 33 varies substantially.

Figure 6:
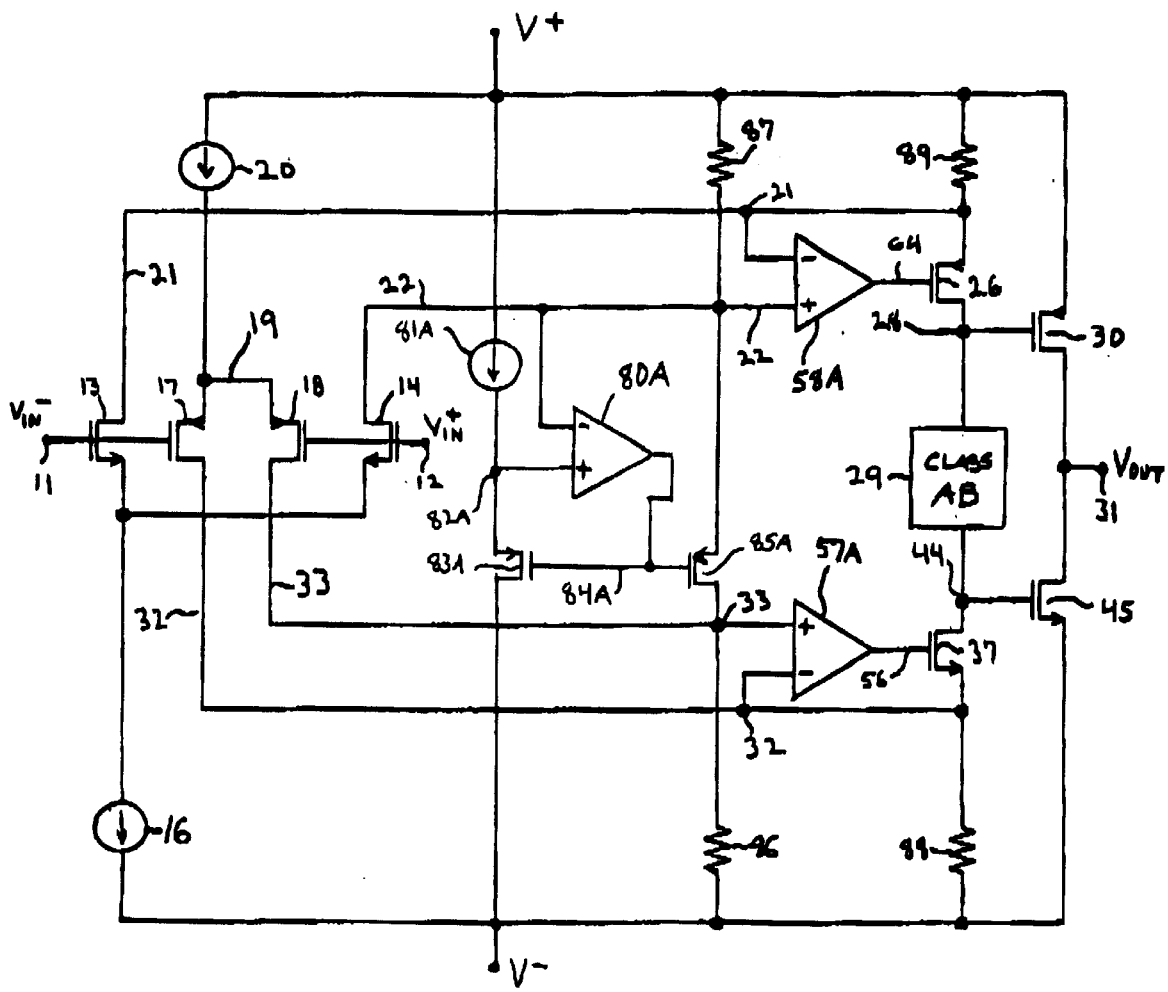
FIG. 6 a schematic diagram of a variation of the embodiment of FIG. 5.

FIG. 6 shows a CMOS operational amplifier which is a variation of the circuit of FIG. 5, wherein transistors 83 and 85 are replaced by P-channel transistors 83A and 85A, respectively. The source and drain of transistor 85A are connected to conductors 22 and 33, respectively. The gates of transistors 83A and 85A are connected by conductor 84A to the output of a differential amplifier 80A, the (−) input of which is connected to conductor 22. The (+) input of amplifier 80A is connected by conductor 82A to the junction 82A between the source of transistor 83A and one terminal of a constant current source 81 A, the other terminal of which is connected to V+.

The rail-to-rail input/output CMOS operational amplifiers 10-4 and 10-5 provide decreased noise over the prior art by decreasing the number of transistors in the signal path.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, in each of the described embodiments, the P-channel MOSFETs can be replaced by N-channel MOSFETs and the N-channel MOSFETs can be replaced by P-channel MOSFETs, if the polarities of the supply voltage rails and reference voltages also are reversed. The gain boost circuits as shown in FIGS. 2 and 3 also could be used in circuits which do not use the biasing circuit including cascode transistor 40, current source 42, and amplifier 43, and instead use the floating current source of above mentioned patent 5,311,145.

What is claimed is:

1. A method of operating a differential amplifier, comprising:

(a) applying an input signal between gates of differentially connected first and second input transistors of a first channel type, and also between gates of differentially connected third and fourth input transistors of the second channel type;

(b) applying a signal produced by the first input transistor to a junction between a source of a first cascode transistor of the second channel type and a first resistive element also coupled to a first supply voltage rail;

(c) applying a signal produced by the third input transistor to a junction between a source of a second cascode transistor of the first channel type and a second resistive element also coupled to a second supply voltage rail;

(d) applying a signal produced between the drain of the first input transistor and a drain of the second input transistor between a first and second inputs of a first gain boost amplifier having an output coupled to the gate of the first cascode transistor, and applying a signal produced between the drain of the third input transistor and a drain of the fourth input transistor between a first and second inputs of a second gain boost amplifier having an output coupled to the gate of the second cascode transistor; and (e) providing an output stage including a pull-up transistor of the second channel type coupled between the first supply voltage rail and the output terminal, a pull-down transistor of the first channel type coupled between the second supply voltage rail and the output terminal, and a class AB bias circuit coupled between drain electrodes of the first and second cascode transistors and the gate electrodes of the pull-up and pull-down transistors.

2. The method of claim 1 wherein a first amplification path through the source of the first cascode transistor is a high frequency signal amplification path, and a second amplification path through the gate of the first cascode MOSFET is a lower frequency amplification path in parallel with the first amplification path.

3. The method of claim 2 wherein a third amplification path through the source of the second cascode transistor is a high frequency signal amplification path, and a fourth amplification path through the gate of the second cascode MOSFET is a lower frequency amplification path in parallel with the third amplification path.

4. A differential amplifier with a rail-to-rail common mode input voltage range, comprising:
(a) first and second supply voltage rails, first and second input terminals, and an output terminal;
(b) a rail-to-rail input stage including differentially connected first and second input transistors of a first channel type, and differentially connected third and fourth input transistors of the second channel type;
(c) a first cascode transistor of the second channel type, a source of the first cascode transistor being coupled by a first resistive element to the first supply voltage rail, the source of the first cascode transistor being coupled to the drain of the first input transistor;
(d) a second cascode transistor of the first channel type, a source of the second cascode transistor being coupled by a second resistive element to the second supply voltage rail, the source of the second cascode transistor being coupled to the drain of the third input transistor;
(e) a first gain boost amplifier having an output coupled to the gate of the first cascode transistor, a first input coupled to the source of the first cascode transistor and to the drain of the first input transistor, and a second input coupled to a drain of the second input transistor and a bias control circuit;
(f) a second gain boost amplifier having an output coupled to the gate of the second cascode transistor, a first input coupled to the source of the second cascode transistor and to the drain of the third input transistor, and a second input coupled to a drain of the fourth input transistor and the bias control circuit; and
(g) an output stage including a pull-up transistor of the second channel type coupled between the first supply voltage rail and the output terminal, a pull-down transistor of the first channel type coupled between the second supply voltage rail and the output terminal, and a class AB bias circuit coupled between drain electrodes of the first and second cascode transistors and the gate electrodes of the pull-up and pull-down transistors.

5. The differential amplifier of claim 4 wherein the bias control circuit includes a third cascode transistor of the second channel type having a drain coupled to the second input of the first gain boost amplifier and also coupled by a third resistive element to the first supply voltage rail, the third cascode transistor having a source coupled to the second input of the second gain boost amplifier and also coupled by a fourth resistive element to the second supply voltage rail.

6. The differential amplifier of claim 4 wherein the first and second resistive elements are resistors.

7. The differential amplifier of claim 5 wherein the first, second, third, and fourth resistive elements are resistors.

8. The differential amplifier of claim 5 wherein a bias voltage of the gate of the third cascode transistor is produced by an amplifier in response to a voltage of the source of the third cascode transistor.

9. A differential amplifier with a rail-to-rail common mode input voltage range, comprising:
(a) first and second supply voltage rails, first and second input terminals, and an output terminal;
(b) a rail-to-rail input stage including differentially connected first and second input transistors of a first channel type, and differentially connected third and fourth input transistors of the second channel type;
(c) a first cascode transistor of the second channel type, a source of the first cascode transistor being coupled to the first supply voltage rail, the source of the first cascode transistor being coupled to the drain of the first input transistor;
(d) a second cascode transistor of the first channel type, a source of the second cascode transistor being coupled to the second supply voltage rail, the source of the second cascode transistor being coupled to the drain of the third input transistor;
(e) a control circuit producing control signals on gate electrodes of the first and second cascode transistors, the control circuit including a first gain boost amplifier having an output coupled to the gate of the first cascode transistor and a first input coupled to the source of the first cascode transistor and to the drain of the first input transistor, the control circuit also including a second gain boost amplifier having an output coupled to the gate of the second cascode transistor and a first input coupled to the source of the second cascode transistor and to the drain of the third input transistor, the control circuit including a third cascode transistor of the first channel type having a drain coupled to a second input of the first gain boost amplifier, a drain of the second input transistor, and to the first supply voltage rail, a source of the third cascode transistor being coupled to a second input of the second gain boost amplifier, a drain of the fourth input transistor, and the second supply voltage rail, the control circuit farther including a fourth cascode transistor of the first channel type having a drain coupled to the first supply voltage rail, a source coupled to a first input of a differential amplifier and to one terminal of a constant current source coupled to the second supply voltage rail and a gate coupled to the gate of the third cascode transistor and the output of the differential amplifier, the differential amplifier having a second input coupled to the source of the third cascode transistor; and
(f) an output stage including a pull-up transistor of the second channel type coupled between the first supply voltage rail and the output terminal, a pull-down transistor of the first channel type coupled between the second supply voltage rail and the output terminal, and a class AB bias circuit coupled between drain electrodes of the first and second cascode transistors and the gate electrodes of the pull-up and pull-down transistors.

10. The differential amplifier of claim 9 wherein the source of the first cascode transistor is coupled to the first supply voltage rail by means of a first resistor, and wherein the source of the second cascode transistor is coupled to the second supply voltage rail by means of a second resister.

* * * * *